US005532618A

United States Patent [19]

Hardee et al.

[11] Patent Number: 5,532,618

[45] Date of Patent: Jul. 2, 1996

[54] STRESS MODE CIRCUIT FOR AN INTEGRATED CIRCUIT WITH ON-CHIP VOLTAGE DOWN CONVERTER

[75] Inventors: Kim C. Hardee; Michael V. Cordoba, both of Colorado Springs, Colo.

[73] Assignees: United Memories, Inc., Colorado Springs, Colo.; Nippon Steel Semiconductor Corporation, Japan

[21] Appl. No.: 983,328

[22] Filed: Nov. 30, 1992

[51] Int. Cl.[6] .................... H03K 17/00

[52] U.S. Cl. .................... 326/63; 327/530; 327/65; 327/72; 327/70; 365/201

[58] Field of Search .................... 365/226, 227, 365/228, 229, 201; 307/296.1, 296.6, 296.8, 296.2, 494, 491; 327/63, 50, 62, 63, 65, 68, 69, 72, 403, 407, 530, 540, 70

[56] References Cited

U.S. PATENT DOCUMENTS

| | | | |
|---|---|---|---|
| 5,046,052 | 9/1991 | Miyaji et al. | 365/227 |
| 5,132,565 | 7/1992 | Kuzumoto | 307/443 |
| 5,187,396 | 2/1993 | Armstrong, II et al. | 302/296.1 |
| 5,349,559 | 9/1994 | Park et al. | 365/201 |
| 5,367,491 | 11/1994 | Han et al. | 327/63 |
| 5,436,582 | 7/1995 | Ikeda | 327/65 |

OTHER PUBLICATIONS

Horiguchi et al., "Dual–Operating Voltage Scheme for a Single 5V 16 Mbit DRAM" *IEEE J. Solid State Cir.*, vol. 23. pp. 1128–1132 (Oct. 1988).

Hori et al., "An Experimental 1 Mbit DRAM Based on High S/N Design," *IEEE J. Solid State Cir.*, vol. SC–19 (Oct. 1984).

Gray & Meyer, *Analysis of Analog Integrated Circuits*, 20 ed. 1977, 1984, pp. 65–67, 705–709, 726–727.

Mao et al., A New On–chip Voltage Regulator for High Density CMOS DRAMs, 1992 Symposium on VLSI Circuits Digest of Technical Papers, pp. 108–109.

*Primary Examiner*—Timothy P. Callahan
*Assistant Examiner*—Dinh T. Le
*Attorney, Agent, or Firm*—Edward D. Manzo; Mark J. Murphy

[57] ABSTRACT

A stress mode circuit is provided to generate a voltage that is either equal to a reference voltage or is a proportion of an external voltage (VCCEXT). The circuit includes two voltage divider circuits to provide the proportion voltage. Two differential amplifiers are provided to generate outputs corresponding to a comparison to the proportion voltage and the reference voltage. The outputs operate switches that couple the reference voltage or the proportion voltage to an output terminal.

17 Claims, 4 Drawing Sheets

STRESS MODE CIRCUIT FOR AN INTEGRATED CIRCUIT WITH ON-CHIP VOLTAGE DOWN CONVERTER

FIELD OF THE INVENTION

The present invention relates to a stress mode circuit for integrated circuits. More particularly, it concerns a stress mode circuit for accelerated reliability testing of integrated circuits which provides a reference voltage for generating an internal power supply voltage (VCC internal) for use in the integrated circuit, where the reference voltage is constant for low values of VCC external and is a ratiometric proportion of VCC external for higher values of VCC external.

BACKGROUND OF THE INVENTION

Some integrated circuits are tested for reliability by increasing their internal power supply voltage. This is typically done to accelerate failures. Devices that set the internal voltage equal to an external voltage (the power supply voltage as applied to the integrated circuit power supply pin, for example) simply raise the external voltage to test for reliability. Raising the internal voltage is referred to as "stress" mode. Stress mode generally connotes the use of an artificially high VCC level.

Some integrated circuits, such as high density memories, operate on a internal operating voltage less than the external voltage VCC, which is typically 5 V. These circuits use this lower internal voltage for better reliability and lower power consumption. However, 5 V is the accepted, industry-wide value of VCC for many applications, thus requiring the use of "voltage down" converters ("VDC") integrated on chips designed to operate on a lower power supply voltage. A VDC provides a lower voltage output than the VCC external it receives.

The ideal characteristics of an on-chip voltage down converter can be seen in FIG. 1. A line 10 represents the relationship between an internal voltage VCC (VCCINT) and an external voltage VCC (VCCEXT) up to a voltage X of VCCEXT. The slope of this line is 1 so that VCCINT=VCCEXT over the range of 0 volts to voltage X. Beyond voltage X, VCCINT is constant (as shown by line 12) regardless of the voltage of VCCEXT (VCCEXT ≧X).

However, where a voltage-down converter is used for maintaining a constant VCCINT while VCCEXT varies (above voltage X), it is impossible to perform accelerated reliability testing (stress mode) because VCCINT cannot be driven above the constant level 12 by simply raising VCCEXT.

There are several ways to overcome this problem. Stress mode circuitry can be implemented to cause VCCINT to be generated equal to: (a) VCCEXT; (b) a proportion of VCCEXT; or (c) a constant voltage drop below VCCEXT. However, some stress mode circuitry uses logic gates requiring timing signals to select the test mode. The disadvantage of this approach is that the circuitry may become active accidentally. For example, during power-up of the chip, the timing signals necessary to enable the stress mode may accidentally be provided. Thus, the chip will be operating in stress mode, without the user's awareness. The chip will quickly become unreliable because of the high voltage applied to the circuit.

A prior art stress mode circuit 13 is shown schematically within FIG. 2. Circuit 13 is comprised of a stress mode circuit 13*a* and a VDC circuit 13*b*. The stress mode circuit includes a comparator 14 and transistors 16, 18, 20, 22, and 26. The VDC of circuit 13 includes transistors 28, 30, 32, 34, 36, 38 and 40. The circuit as shown has inputs coupled to receive an external supply voltage VCCEXT, a reference voltage VR, a voltage VG which is proportionate to VR, and VCCEXT/5. VG is generated as a comparison voltage to VCCEXT/5. Circuit 13 outputs VCCINT.

When VG≧VCCEXT/5, circuit 13 is not in the stress mode. Comparator 14 outputs a high signal to a p-channel transistor 16, maintaining transistor 16 off. Transistors 18, 20 and 22 are configured as a voltage divider circuit. The voltage at a node 24 is ⅓ VCCEXT when transistor 16 is on, and is between OV and VTP (approximately 0.7 V) when transistor 16 is off.

Continuing in the case where VG>VCCEXT/5, transistor 16 is off. The voltage at node 24 is low. Since node 24 is coupled to the gate of an n-channel transistor 26, transistor 26 is off or nearly off. The input to the gate electrode of transistor 28 is VR. Transistors 28, 30, 32, 34, 36, 38 and 40 are configured so that the internal voltage VCCINT supplied at a node 42 is 2VR. Transistors 38 and 40 are configured as another voltage divider circuit. The voltage at a node 44 is VCCINT/2 or VR.

Turning to the stress mode, i.e. when VCCEXT/5>VG, comparator 14 outputs a low signal to turn on transistor 16. The voltage at node 24 will be ⅓ VCCEXT, which is supplied to and turns on transistor 26. The internal voltage VCCINT at node 42 will not be ⅔ VCCEXT because VR is still being applied to transistor 28. Transistors 26 and 28 are both on, which provide more current drive capability than if only transistor 26 were on. This pulls a voltage at a node 27 down more than if only transistor 26 were on. The lower voltage at node 27 will turn transistor 36 on harder. Therefore, the voltage at node 44 supplied to gate transistor 30 will be greater than ⅓ VCCEXT to compensate for VR being applied to transistor 28 during stress mode. Thus, VCCINT, which is two times the voltage at node 44, will be greater than ⅔ VCCEXT.

One of the disadvantages of this circuit when in test mode is it does not supply a VCCINT proportional to VCCEXT. Further, both VR and the voltage supplied from node 24 to the gate of transistor 26 are inputs that influence VCCINT. It is harder to tune the FIG. 2 circuit to produce a proportion of VCCEXT because the two input voltages must each be individually adjusted.

Therefore, it is a general object of the present invention to overcome the above-mentioned problems.

Another object of the present invention is to provide a circuit where the transition point for VCCINT from a constant to a ratio of VCCEXT can be set independent from that ratio.

SUMMARY OF THE PRESENT INVENTION

This invention provides a test mode circuit for accelerated reliability testing of an integrated circuit chip. It provides a constant reference voltage over a range of low voltages of VCCEXT. It further provides a reference voltage substantially equal to a proportion of VCCEXT when performing accelerated reliability testing. The reference voltage is used to generate an internal VCC. VCCINT will be constant while the reference voltage is constant, and will be proportionate to VCCEXT when the reference voltage is proportionate to VCCEXT for stress mode.

A preferred embodiment of the present invention includes a comparator for comparing a reference voltage to a proportionate value of VCCEXT. It also includes a circuit that provides the proportion of VCCEXT, and switches to provide as an output either the reference voltage or the proportion of VCCEXT.

A novel and important aspect of the operation of such voltage converter is its ability to provide a reference voltage, and thus a VCCINT, that is constant over a range of low voltage values for VCCEXT, and is only a ratiometric proportion of VCCEXT when the circuit performs accelerated reliability testing.

Another important aspect of such test mode circuit is that the ratio of VCCINT to VCCEXT during test mode and the level of the reference voltage when in normal operation can be set by using transistors of varying sizes.

The invention also includes a method for operating a test mode circuit. A method of operating the circuit may comprise the steps of: (1) comparing a reference voltage VREF to a proportionate voltage VCCEXT*; (2) supplying the reference voltage VREF as an output when VREF>VCCEXT*; and (3) supplying VCCEXT* as an output when VCCEXT*>VREF.

BRIEF DESCRIPTION OF THE DRAWINGS

The invention, together with its objects and the advantages thereof, may best be understood by reference to the following detailed description taken in conjunction with the accompanying drawings with which.

DETAILED DESCRIPTION OF THE PREFERRED EMBODIMENT

Figure 3:
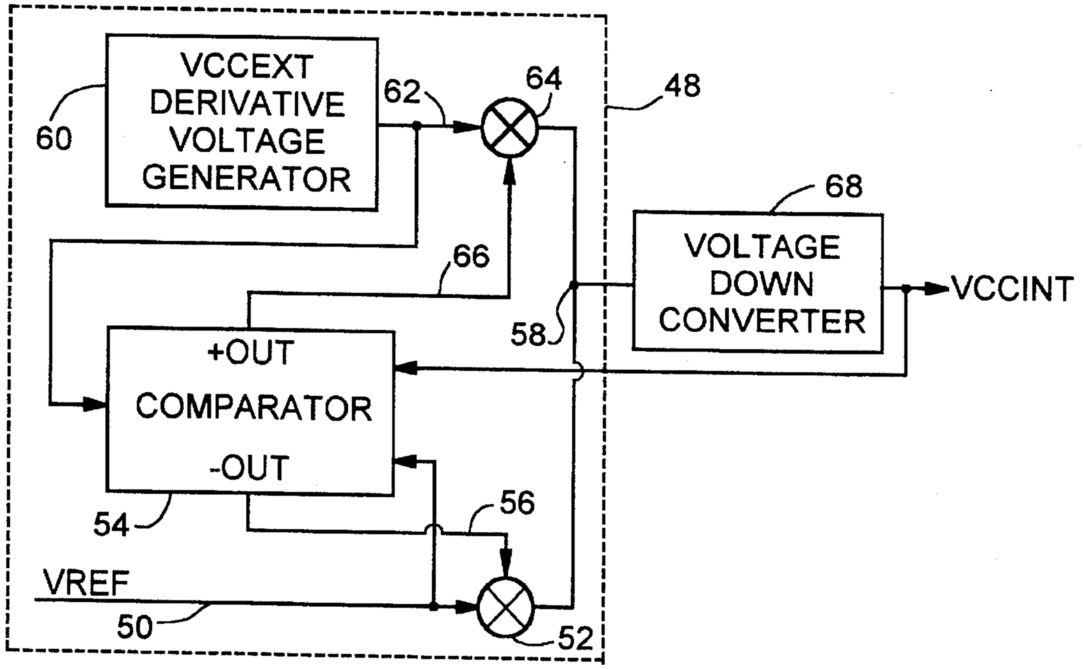
FIG. 3 is a block diagram of the preferred embodiment of the present invention.

FIG. 3 contains a block diagram of the preferred embodiment of the present invention. A circuit 48 receives various inputs and provides a signal to a voltage down converter 68. Preferably, all of this circuitry is on the same chip as the host circuitry, e.g. a memory or other device.

Within circuit 48, a reference voltage VREF generated elsewhere on-chip (or offchip) is conducted by a line 50 to a switch 52. Reference voltage VREF is also supplied to a first input terminal of a comparator 54. Comparator 54 outputs a control signal to switch 52 via a line 56. Switch 52 selectively couples reference voltage VREF to a node 58.

Figure 5:
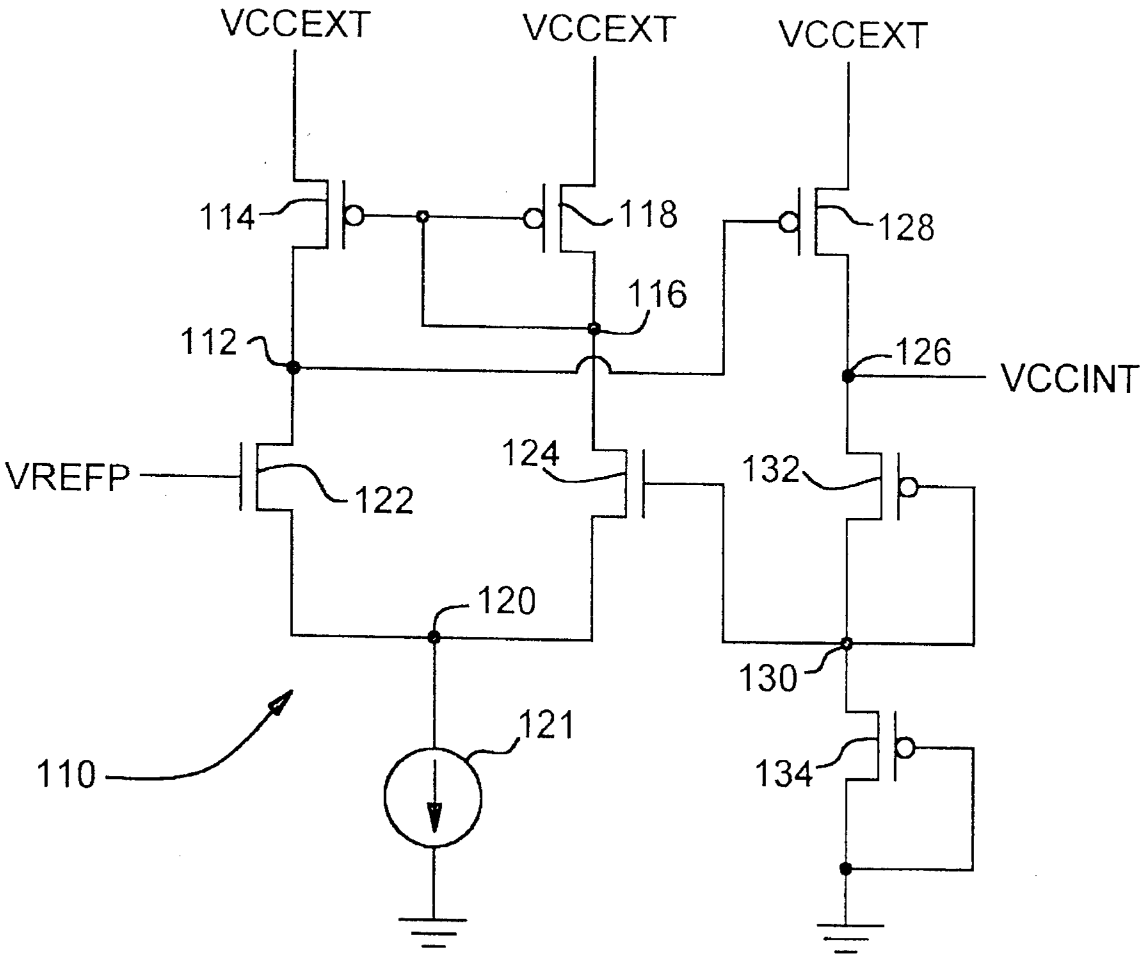
FIG. 5 is an exemplary configuration of a voltage down converter coupled to the FIG. 4 diagram.

A VCCEXT derivative voltage generator 60 provides a voltage conducted by a line 62 to a switch 64. The voltage provided by generator 60 is provided to a second input terminal of comparator 54. Comparator 54 outputs a second control signal to switch 64 via a line 66. Switch 64 selectively couples the voltage conducted by line 62 to node 58. Node 58 is coupled to an input of a voltage down converter 68 that outputs an internal voltage VCCINT. VDC 68 may or may not be configured as the VDC of circuit 13 in FIG. 2. FIG. 5 is an exemplary illustration of VDC 68.

Details of the FIG. 3 embodiment (circuit 48) will be explained with reference to FIG. 4, which shows comparator 54, generator 60, and switches 52 and 64. Within comparator 54, a differential amplifier is implemented by transistors 70, 72, 74, 76, 78, 80 and 82. Illustratively, field effect transistors are used, but bipolar technology could be employed, or other implementations. VREF is supplied to gate electrodes of transistors 70 and 72. A voltage 0.3 VCCEXT is generated by VCCEXT derivative voltage generator 60 and is supplied to a gate electrode of transistor 74 via a node or line **62*a***.

The voltage 0.3 VCCEXT is an arbitrary proportion of voltage VCCEXT, and may be one of a range of proportions of VCCEXT. In the instance where 0.3 VCCEXT<VREF, transistor 74 will be turned on less than transistor 72. (Since they have their sources coupled to each other, their conductivity is determined by the respective gate voltages). A voltage at a node 84 will be less than a voltage at a node 86 since transistor 72 allows more current to pass through active transistor 70 to a second voltage supply or reference voltage (typically ground). With VCCINT applied to the gate electrodes of both transistors 76 and 78, transistor 78 will allow more current to pass than transistor 76 because the gate-source voltage of transistor 78 is greater than the gate-source voltage of transistor 76. Therefore, a voltage at a node 88 will be less than a voltage at node 90.

The voltage at node 88 is coupled to the gate electrodes of transistors 80 and 82, both of which have source electrodes coupled to receive VCCEXT. Since the gate-source voltages of transistors 80 and 82 are the same, they both conduct the same amount of current. But, transistor 76 has a higher source-drain path resistance than transistor 78 since it is not turned on as hard as transistor 78. Therefore, the current from transistor 82 causes a greater voltage drop across transistor 76 than the current from transistor 80 through transistor 78. The result is that node 90 is pulled up to a higher voltage. This makes n-channel transistor 52 more conductive.

Where 0.3 VCCEXT at node **62*a* is>VREF, transistor 74 is turned on more than transistor 72. Node 86 will have a lower voltage than node 84 because transistor 74 is conducting more current. With VCCINT controlling both transistors 76 and 78, transistor 76 will be turned on more than transistor 78 since the gate-source voltage of transistor 76 is greater than the gate-source voltage of transistor 78. The voltage at node 90 will be less than the voltage at node 88**.

The gate voltage of transistor 82 is equal to the voltage at node 88 since :node 88 is coupled to the gate electrode of transistor 82. Since the gate-source voltage of transistors 80 and 82 are the same, they both conduct the same amount of current. However, transistor 76 has a lower source-drain path resistance than transistor 78 because transistor 76 is turned on harder than transistor 78. Therefore, the current from transistor 82 causes a lower voltage drop across transistor 76 than the current from transistor 80 through transistor 78. Node 90 is pulled down to a lower voltage than it had for the condition 0.3 VCCEXT<VREF. This makes transistor 52 less conductive.

The voltage at node 90 is supplied via line 56 to switch 52. Switch 52 is illustratively a single n-channel transistor. Line 56 is coupled to the gate of this transistor to control it in response to the inputs of the differential amplifier. For VREF>0.3 VCCEXT, the transistor of switch 52 is on. VREF is thereby coupled to node 58 as VREFP, to be supplied as an input to the voltage down converter (not shown) to generate VCCINT. For VREF<0.3 VCCEXT, transistor 52 is off.

Figure 4:
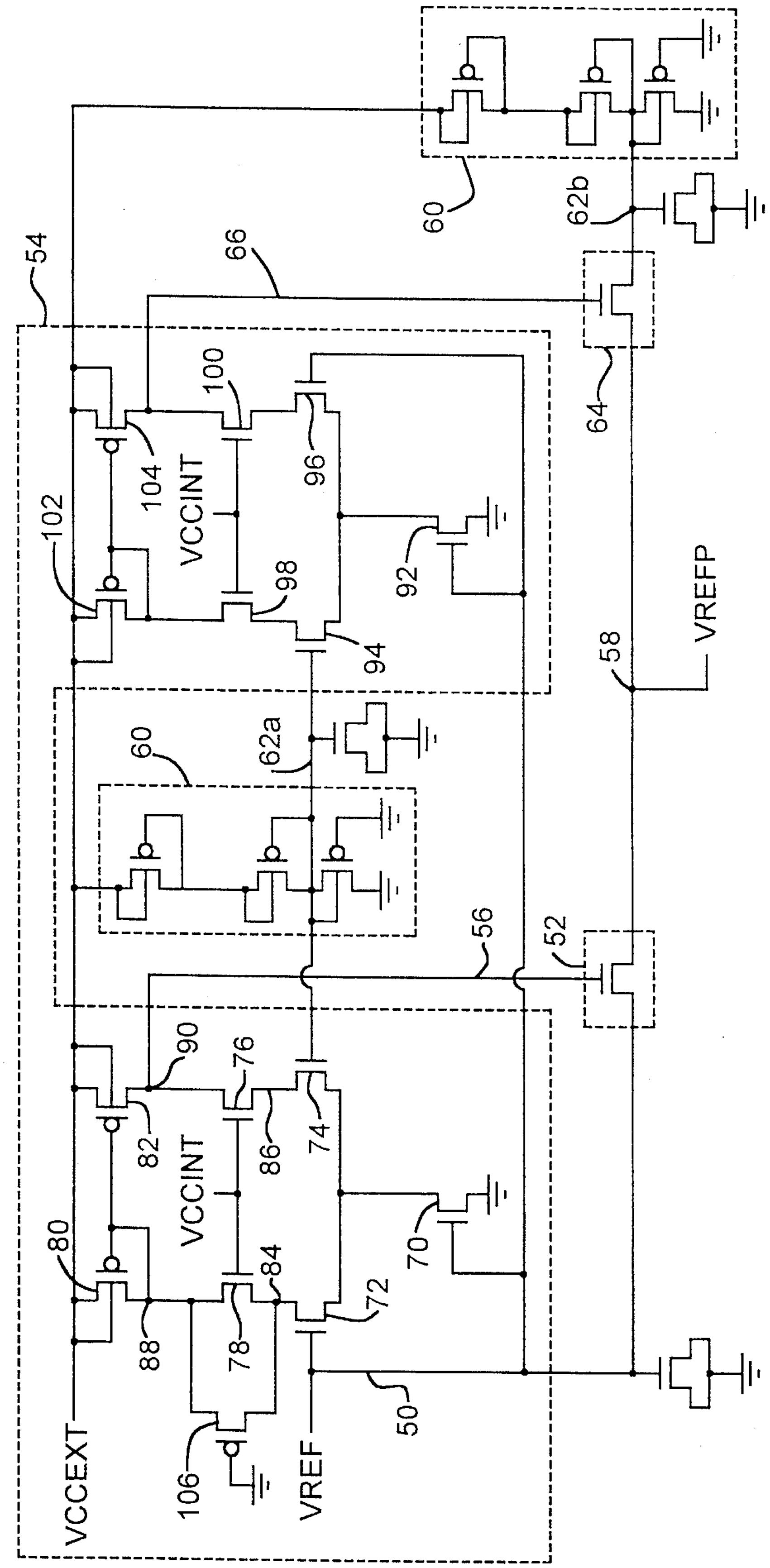
FIG. 4 is a detailed diagram of the FIG. 3 embodiment.

A second differential amplifier is preferably included in the FIG. 4 embodiment. This second differential amplifier, implemented by transistors 92, 94, 96, 98, 100, 102 and 104, has a similar function as the first differential amplifier, but the inputs VREF and 0.3 VCCEXT are reversed. The second differential amplifier is configured so that its output supplied on line 66 is high when VREF<0.3 VCCEXT.

The output of the second differential amplifier is supplied via line 66 to switch 64. Switch 64 is illustratively a single n-channel transistor. Line 66 is coupled to the gate electrode of this transistor. This transistor is turned on when the voltage on line 66 is high. The voltage on line 66 goes high in response to the comparison of the VREF and 0.3 VCCEXT to inputs of the second differential amplifier. For VREF>0.3 VCCEXT, the output on line 66 is low and the transistor of switch 64 is off. For VREF<0.3 VCCEXT, the output on line 66 is high and the transistor of switch 64 is on. A voltage of 0.3 VCCEXT is now provided as the voltage VREFP, supplied by line 62*b* from VCCEXT derivative voltage generator 60. Hence, in FIG. 4, the differential amplifier on the left and switch 52 provide VREF as VREFP if VREF>0.3 VCCEXT, and the differential amplifier on the right and switch 64 provide 0.3 VCCEXT as VREFP if VREF>0.3 VCCEXT. In other words, VREFP will be the greater of VREF or 0.3 VCCEXT.

Further details of the FIG. 3 embodiment will be explained by referring to FIG. 5. Circuit 110 of FIG. 5 illustrates an exemplary configuration for VDC 68 of FIG. 3. Circuit 110 receives voltages VREFP and VCCEXT, and outputs VCCINT.

Briefly, VCCEXT is selectively coupled to a node 112 through a source-drain path of a transistor 114. VCCEXT is selectively coupled to a node 116 through a source-drain path of a transistor 118. Gate electrodes of transistors 112 and 114 are coupled together. The gate electrodes of transistors 112 and 114 are coupled to node 116. Node 112 is selectively coupled to node 120 through a source-drain path of a transistor 122. Node 116 is selectively coupled to a node 120 through a source-drain path of a transistor 124. Node 120 is coupled to a reference voltage (e.g. ground) through a current source 121. A gate electrode of transistor 122 is coupled to receive VREFP.

VCCEXT is selectively coupled to a node 126 through a source-drain path of a transistor 128. A gate electrode of transistor 128 is coupled to node 112. Node 126 is selectively coupled to a node 130 through a source-drain path of a transistor 132. Node 130 is coupled to a gate electrode of transistor 124. Node 130 is also coupled to a gate electrode of transistor 132. Node 130 is selectively coupled to ground through the source-drain path of a transistor 134. A gate electrode of transistor 134 is coupled to ground.

FIG. 5 operates in such a manner as to maintain the voltage applied to the gate electrode of transistor 124 from node 130 substantially equal to VREFP. When VREFP=VREF (normal operation), the voltage at node 130 tracks and is approximately equal to VREFP to maintain a substantially constant VCCINT. VREFP, as explained previously, provides a voltage VREF that is constant over varying VCCEXT until a proportion of VCCEXT exceeds VREF. At this point, VREFP equals the proportion of VCCEXT for stress mode operation.

As VCCEXT continues to rise VREFP changes from VREF (normal operation) to the proportion of VCCEXT (stress mode), and the voltage at the gate electrode of transistor 122 increases. Transistor 122 is turned on harder to pull the voltage at node 112 lower. The lower voltage at node 112 will turn on transistor 128 harder to pull the voltage at node 126 (VCCINT) higher. VCCINT is pulled higher until VREFP stops increasing. The higher voltage at node 126 causes the voltage at node 130 to increase since transistors 132 and 134 act as a voltage divider.

The increased voltage at node 130 turns transistor 124 on harder to pull the voltage at node 116 lower. The lower voltage at node 116 will turn on transistor 114 harder to pull the voltage at node 112 higher. At this point, the voltage at node 112 maintains transistor 128 barely on to compensate for leakage current at node 126.

For example, normal operating voltages preferred implementations of the present invention shown herein are preferably VREFP=VREF=1.5 V, VCCINT=3.3 V, VCCEXT=5 V and the proportion of VCCEXT<VREF. VCCINT is preferably equal to approximately 2.2 VREFP regardless whether the chip is in normal operation or stress mode.

When the proportion of VCCEXT exceeds VREF, VREFP equals that proportion of VCCEXT. The proportion of VCCEXT may increase to approximately 2.1 V when VCCEXT reaches approximately 7 V. VCCINT equals approximately 4.62 V. Accelerated testing is performed while VCCINT is at such a high voltage.

Figure 2:
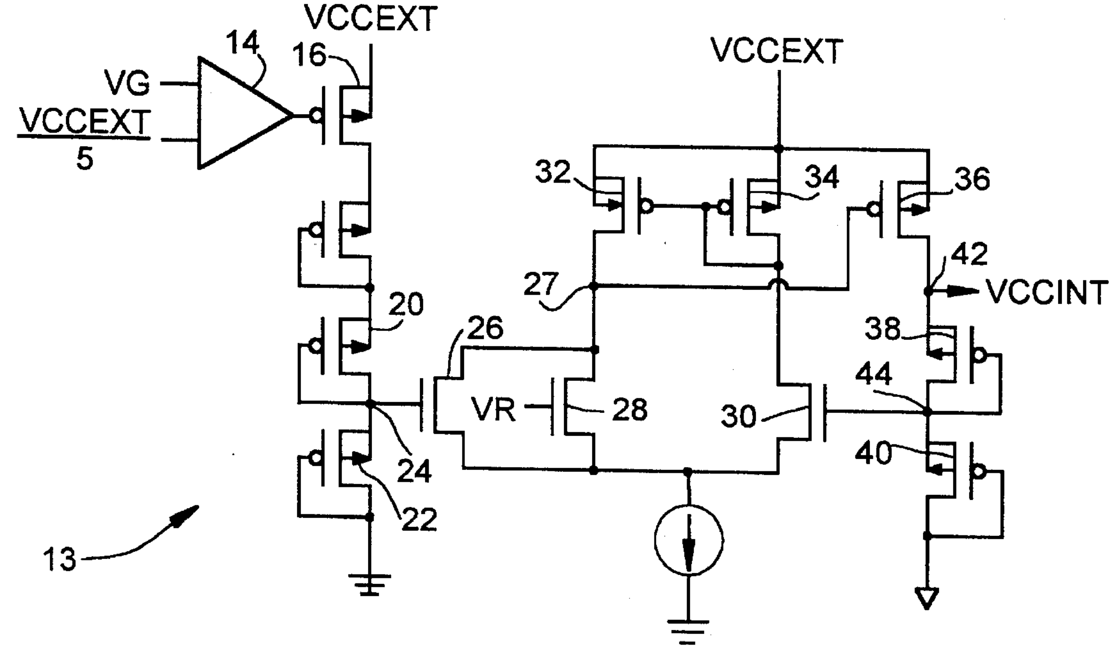
FIG. 2 PRIOR ART
FIG. 2 is a detailed diagram of a prior art voltage down converter responsively coupled to test mode circuitry.

It will be appreciated that the preferred embodiment of the present invention supplies a voltage VREFP which can be used to generate VCCINT for normal and stress mode operations without the need for other input voltages. This obviates the need for two voltage inputs to determine VCCINT, as shown in FIG. 2 by transistors 26 and 28. Any fine tuning problems in using two input comparison voltages to generate VCCINT are eliminated. Accordingly, internal voltage VCCINT will be a more accurate proportion of VCCEXT.

It will be appreciated that the FIG. 3 embodiment is not coupled to receive any clock signals. The FIG. 3 embodiment will not accidentally enter stress mode, for example, when the chip is powered up.

Transistor 106 is used as a power-up transistor for the circuit in FIG. 4. When powering up the preferred embodiment of the present invention, transistor 106 allows current to bypass transistor 78. This pulls the voltage at node 88 lower than the voltage at node 90. Transistor 82 will have a higher current drive capability due to the voltage drop between its gate and drain. Node 90 will be pulled closer to VCCEXT. The signal on line 56 will have a high voltage.

If transistor 106 were not used, upon power-up the voltage a node 90 and the voltage of the signal on line 56 would be unknown. The preferred embodiment of the present invention requires the signal on line 56 to power up with a high voltage in order to provide VREF as VREFP.

Transistors 76, 78, 98 and 100 in FIG. 4 are utilized to prevent a voltage drop VCCEXT–VSS across some of the transistors in the first and second differential amplifiers. This is preferred since tile present embodiment is using transistors of such small dimensions that a large voltage drop across tile transistors (VCCEXT–VSS) may cause punch-through or gated-diode breakdown.

Although VCCEXT derivative voltage generator 60 is implemented in FIG. 4 as two voltage dividers, other circuitry may be used to supply a voltage via lines 62*a* and 62*b*. It is preferable to use two voltage divider circuits for VCCEXT derivative voltage generator 60 for the following reason: switches 52 and 64 may be active at the same time, thus coupling line 50 which conducts VREF to line 62*b* which conducts (0.3) VCCEXT. This coupling may cause voltage fluctuations on line 62*b*. If line 62*b* were also coupled to the inputs of the differential amplifiers via line 62*a*, then the outputs of the differential amplifiers would be adversely affected. Therefore, separate voltage dividers are provided to avoid this situation.

It is preferred that the two differential amplifiers do not switch outputs at the same time in order to provide a more stable VREFP. To avoid this, it is preferred that transistor 74 has a greater channel length than transistor 72, 94 and 96. This will make the first differential amplifier (including transistor 74) switch after the second differential amplifier does. It should be noted that other modifications to the amplifier can achieve the same result.

It is also possible to change tile transistor sizes to adjust the proportionate of VCCEXT for the stress mode, and to adjust the point where VREFP transitions between VREF and the proportion of VCCEXT. To adjust the proportion of VCCEXT, the voltage divider coupled to switch 64 can be modified to output a different voltage. This in turn will be a different proportion of VCCEXT supplied to VREFP when in the stress :mode. The slope of line VREFP after line 140 in FIG. 6 will be adjusted according to the output of the voltage divider 60 coupled to switch 64. Varying the proportion of VREFP will vary VCCINT according to the needs of the user for stress mode operation.

Figure 1:
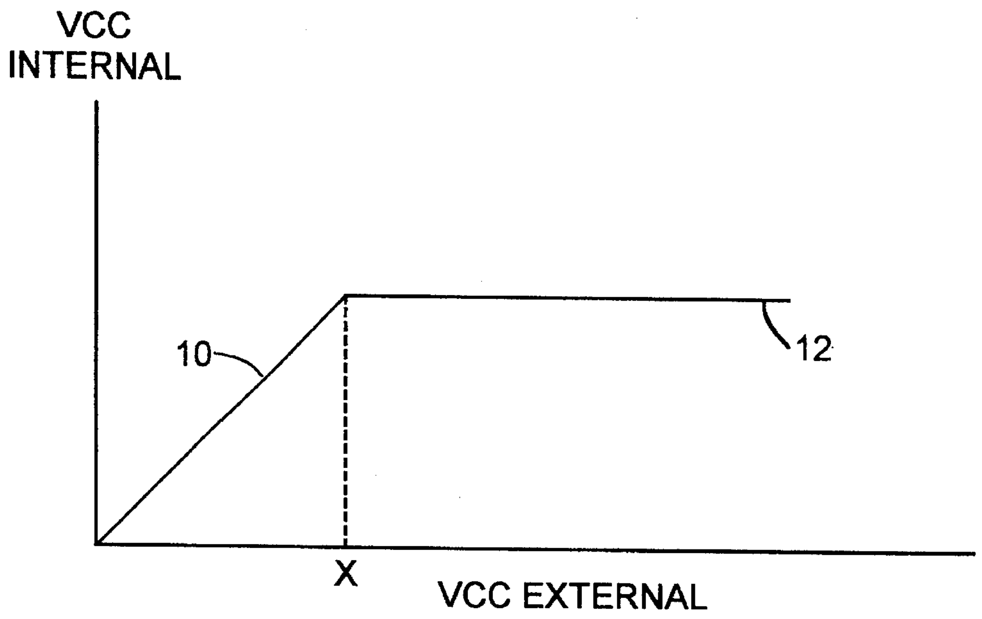
FIG. 1 is a graph of an input-output characteristic of an on-chip voltage down converter.
Figure 6:
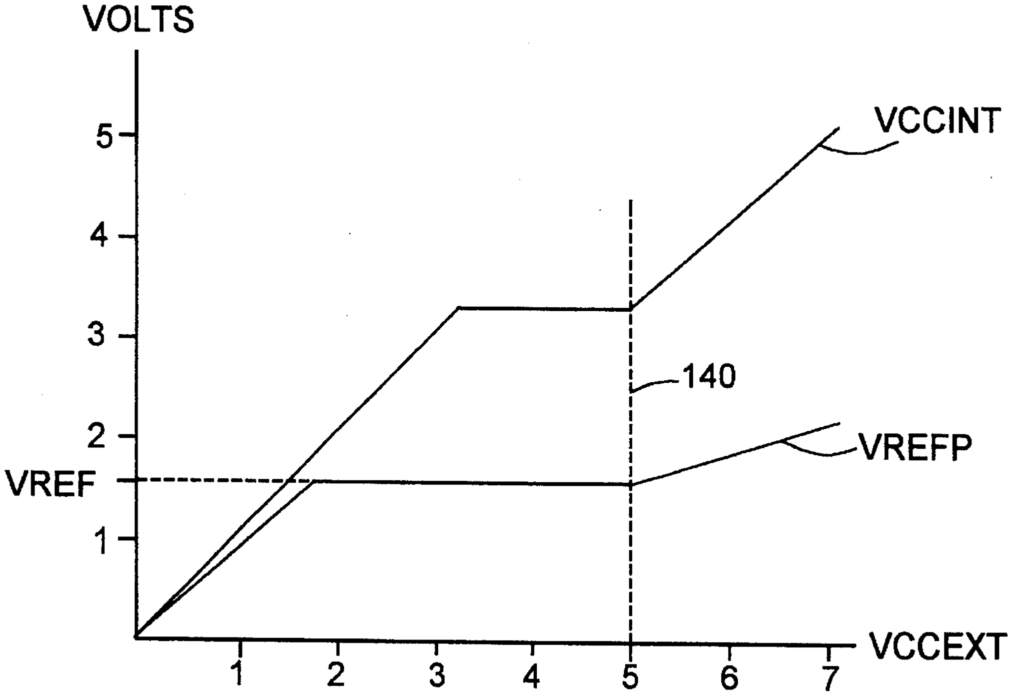
FIG. 6 is a graph of VCCINT and VREFP versus VCCEXT for the FIG. 3 embodiment.

To adjust the transition point shown by line 140 in FIG. 6, the voltage divider circuit 60 coupled to the inputs of the differential amplifiers can be adjusted to provide different voltages. For example, if the output voltage of voltage divider circuit 60 is increased, then the differential amplifiers would switch at a point to the left of line 140 as VCCEXT increases. If the output voltage is decreased (a lesser proportion of VCCEXT), then VREFP will transition at a point to the right of line 140.

The advantages of the present invention are particularly suited for testing the reliability of the chip in which tile present invention can be integrated. For example, a test engineer will operate a chip in stress mode (high VCCINT) until it fails. Based on the time that the chip took to fail while in stress mode, the test engineer will calculate the life expectancy of the chip for a given reliability.

The calculated life expectancy is also determined from VCCINT during stress mode. The problem is that the chip has no pins connected to VCCINT that are available externally of the chip package. Therefore, the test engineer must use the value of VCCINT that is supplied by design engineers. If VCCINT is not accurately known, the calculated life expectancy reflects this inaccuracy.

The actual VCCINT generated by the prior art circuit shown in FIG. 2 cannot be accurately and precisely calculated since VCCINT is determined by both the voltages input to the gates of transistors 26 and 28. In essence, the operation ranges for both voltages input to the gate electrodes of transistors 26 and 28 propagate to create a larger operation range of VCCINT for the FIG. 2 circuit than the present invention. This leads to the calculated VCCINT of the FIG. 2 circuit being less precise and accurate than the actual VCCINT of the FIG. 2 circuit in operation. Thus, the life expectancy determination is less accurate.

Further, the prior art circuit in FIG. 2 does not have a well-defined transition from normal operation to stress mode. This may cause a problem when determining whether the device is in stress mode or normal operation. If chip enters stress mode at too low a value for VCCEXT, then unnecessary power is consumed. Further, the tester or the user may not know if the device is in stress mode, which will decrease the life expectancy of the chip.

It should be appreciated that the foregoing description is directed to a preferred embodiment of the present invention, and that numerous modifications or alterations can be made without departing from the spirit or scope of the present invention.

What is claimed as the invention is:

1. A stress mode circuit comprising:

a comparison circuit having a plurality of outputs and coupled to receive and compare a reference voltage with a first voltage derived from a supply voltage;

a plurality of switches each respectively coupling said reference voltage and said first voltage to a common output terminal and each respectively controlled by one of said plurality of outputs; and a voltage converter coupled between said common output terminal and an output terminal of said stress mode circuit for providing an internal voltage to said output terminal and said comparison circuit, wherein said reference voltage and said first voltage are selectively coupled to said common output terminal via said plurality of switches in response to the comparison of the reference voltage and said first voltage, and wherein said comparison circuit is powered by said supply voltage.

2. The circuit of claim 1 wherein said switches are responsive to said comparison circuit so that a larger one of said reference voltage and said first voltage is selectively coupled to said common output terminal.

3. The circuit of claim 1 further comprising a voltage generator coupled to said supply voltage to generate said first voltage.

4. The circuit of claim 3 wherein said voltage generator includes at least one voltage divider circuit connected to receive said supply voltage and produce therefrom said first voltage, of a magnitude lower than the supply voltage, for application to said comparison circuit.

5. The circuit of claim 1 wherein said comparison circuit includes at least two differential amplifiers coupled to receive said reference voltage and said first voltage and to generate respective outputs that have opposite states in response to the comparison of said reference voltage and said first voltage.

6. The circuit of claim 5 wherein said plurality of switches includes at least two switches, wherein said switches are responsively coupled to said respective outputs of said differential amplifiers thereby to couple a selected one of said reference voltage and said first voltage to said common output terminal.

7. A stress mode circuit comprising:

first and second voltage generator circuits coupled to a supply voltage for generating respective first and second outputs;

first and second comparison circuits each having respective first and second input terminals and respective outputs, said comparison circuits being powered by said supply voltage which is greater in magnitude than magnitudes of said first and second outputs from said first and second voltage generator circuits;

said first input terminal of said first comparison circuit and said second input terminal of said second comparison circuit being coupled to receive a reference voltage, said second input terminal of said first comparison circuit and said first input terminal of said second comparison circuit being coupled to receive said first output;

a first switch coupling said reference voltage to a common output terminal in response to the output of said first comparison circuit, a second switch coupling said second output to said common output terminal in response to the output of said second comparison circuit; and a voltage converter coupled between said common output terminal and an output terminal of said stress mode circuit for providing an internal voltage to said output terminal and said first and second comparison circuits.

8. The circuit of claim 7 wherein at least one of said voltage generator circuits includes a voltage divider circuit.

9. The circuit of claim 7 wherein at least one of said comparison circuits includes a differential amplifier.

10. The circuit of claim 9 wherein said differential amplifier includes a plurality of transistors, at least one of which is coupled between at least two other transistors of said plurality to eliminate a large voltage drop across either of said at least two other transistors.

11. The circuit of claim 10 further including a power-up transistor coupled in parallel to said at least one transistor.

12. The circuit of claim 7 wherein at least one of said switches includes a transistor.

13. The circuit of claim 7 wherein said stress mode circuit is an integrated circuit.

14. A method to operate a stress mode circuit comprising the steps of:

providing a power supply voltage to power a comparing circuit;

applying a reference voltage and another voltage derived from said power supply voltage and which has a voltage magnitude lower than a voltage magnitude of said power supply voltage to inputs of said comparing circuit;

in said comparing circuit, comparing said reference voltage to said another voltage for generating a plurality of control signals to control a plurality of corresponding switches based on results of the comparison within said comparing circuit;

selecting between said reference voltage and said another voltage and providing said selected voltage to a common output terminal based on said applying and comparison steps; and converting said selected voltage into an internal voltage using a voltage converter and providing said internal voltage to an output terminal of said stress mode circuit and to said comparing circuit.

15. The method of claim 14 wherein said power supply voltage is an external power supply voltage, the method wherein the comparing step includes generating first and second output signals; and said selecting step includes controlling first and second transistors each connected to said common output terminal.

16. The method of claim 15 wherein the comparing and generating at least one output steps include performing first and second comparisons and generating the first and second outputs based respectively thereon.

17. The method of claim 14 wherein said selecting step includes selecting and outputting a larger one of the another voltage and the reference voltage;

wherein in a first range of power supply voltages where the reference voltage is larger than the another voltage, the internal voltage is based on the reference voltage, and wherein in a second range of power supply voltages where the reference voltage is smaller than the another voltage, the internal voltage is based on the another voltage;

whereby variations in the power supply voltage that fall within said tint first range of voltages do not directly cause variations in the internal voltage.

* * * * *